United States Patent
Rodrigues Goncalves et al.

(10) Patent No.: US 11,107,938 B2
(45) Date of Patent: Aug. 31, 2021

(54) PHOTODIODE

(71) Applicant: STMicroelectronics (Crolles 2) SAS, Crolles (FR)

(72) Inventors: Boris Rodrigues Goncalves, Le Touvet (FR); Arnaud Tournier, Grenoble (FR)

(73) Assignee: STMicroelectronics (Crolles 2) SAS, Crolles (FR)

(*) Notice: Subject to any disclaimer, the term of this patent is extended or adjusted under 35 U.S.C. 154(b) by 0 days.

(21) Appl. No.: 16/789,997

(22) Filed: Feb. 13, 2020

(65) Prior Publication Data

US 2020/0266310 A1    Aug. 20, 2020

(30) Foreign Application Priority Data

Feb. 14, 2019  (FR) ...................................... 1901504

(51) Int. Cl.
| | | |
|---|---|---|
| *H01L 31/0352* | (2006.01) | |
| *H01L 27/146* | (2006.01) | |
| *H01L 31/02* | (2006.01) | |
| *H01L 31/0203* | (2014.01) | |

(52) U.S. Cl.
CPC .. *H01L 31/035281* (2013.01); *H01L 31/0203* (2013.01); *H01L 31/02005* (2013.01)

(58) Field of Classification Search
CPC ................. H01L 31/035281; H01L 31/02005
USPC .................................................. 257/446, 461
See application file for complete search history.

(56) References Cited

U.S. PATENT DOCUMENTS

| | | | | |
|---|---|---|---|---|
| 6,177,289 B1* | 1/2001 | Crow | .............. | H01L 31/035281 257/E31.038 |
| 6,538,299 B1 | 3/2003 | Kwark et al. | | |
| 6,943,409 B1* | 9/2005 | Cheng | .................... | B82Y 20/00 257/330 |
| 2003/0122210 A1* | 7/2003 | Cohen | ................... | H01L 31/105 257/465 |
| 2015/0279878 A1 | 10/2015 | Ahmed et al. | | |

FOREIGN PATENT DOCUMENTS

EP    3188238 A1    7/2017

OTHER PUBLICATIONS

INPI Search Report and Written Opinion for FR 1901504 dated Nov. 27, 2019 (8 pages).

* cited by examiner

*Primary Examiner* — David Vu
*Assistant Examiner* — Brandon C Fox
(74) *Attorney, Agent, or Firm* — Crowe & Dunlevy

(57) ABSTRACT

A photodiode include a first substrate layer of a first dopant type and a second substrate layer of a second dopant type on top of the first substrate layer. Semiconductor walls are provided in a semiconductor substrate which includes the first and second substrate layers. The semiconductor walls include: two outer semiconductor walls and at least one inside semiconductor wall positioned between the two outer semiconductor walls. Each inside semiconductor wall is located between two semiconductor walls having longer length.

25 Claims, 4 Drawing Sheets

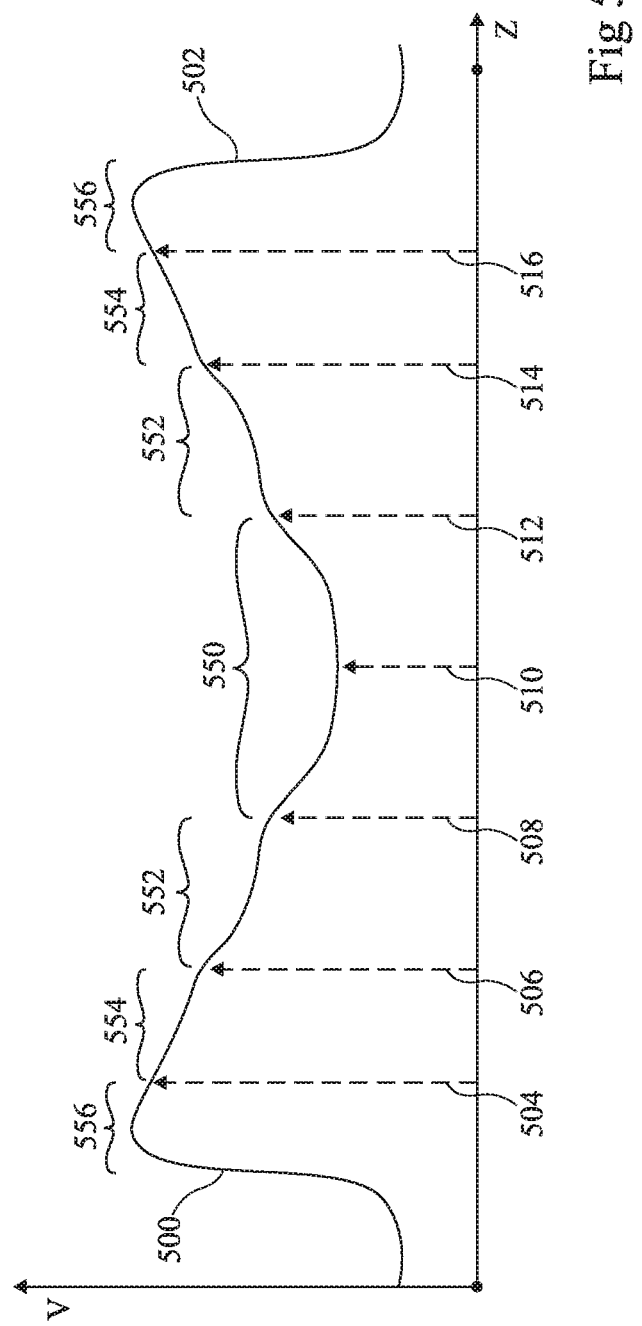

PHOTODIODE

PRIORITY CLAIM

This application claims the priority benefit of French Application for Patent No. 1901504, filed on Feb. 14, 2019, the content of which is hereby incorporated by reference in its entirety to the maximum extent allowable by law.

TECHNICAL FIELD

The present disclosure relates generally to electronic components and more specifically to photodiodes.

BACKGROUND

A photodiode is a semiconductor component which has the capability of detecting radiation from the optical domain and transforming it into an electric signal. More specifically, light forms electrons in the active zone of the photodiode. These electrons must then be retrieved by an electric circuit.

In a 2D-imaging or 3D-imaging sensor comprising photodiodes, the electrons formed at a given moment, during the capture of a scene, are stored in memories, and the quantity of electrons is then read by a circuit so as to obtain a datum regarding the scene.

In order for the datum regarding the scene to be precise and to correspond to the given moment, it is preferable if the electrons move rapidly toward the memories.

SUMMARY

In an embodiment, a photodiode comprises two outer semiconductor walls and at least one inside semiconductor wall, each inside semiconductor wall being located between two longer walls.

According to an embodiment, the outer walls and the at least one inside wall extend along the entire height of the photodiode.

According to an embodiment, the outer walls and the at least one inside wall extend through an entire substrate in which the photodiode is formed.

According to an embodiment, the photodiode comprises n rows of inside walls, n being an integer greater than or equal to 1.

According to an embodiment, the inside walls of a same row have substantially the same length when viewed from above.

According to an embodiment, the photodiode comprises $2^{(i-1)}$ inside walls of the row i, where i is an integer in the range of 1 to n.

According to an embodiment, the inside walls of the row i, wherein i is an integer comprised in the range of 2 to n, have a length that is substantially equal to ¾ of the length of the inside walls of the row i−1.

According to an embodiment, a negative voltage is applied to the inside and outer walls.

According to an embodiment, outer semiconductor walls, including the outer walls, at least partially surround the active zone of the photodiode.

According to an embodiment, the inside walls are interconnected by one of the outer walls.

According to an embodiment, the outer walls entirely surround the active zone of the photodiode.

According to an embodiment, the inside and outer walls have a width, when viewed from above, comprised in the range of approximately 100 and approximately 300 nm.

According to an embodiment, the inside walls are separated from the closest inside or outer walls by a distance that is equal to substantially five times their width, when viewed from above.

BRIEF DESCRIPTION OF THE DRAWINGS

The foregoing features and advantages, as well as others, will be described in detail in the following description of specific embodiments given by way of illustration and not limitation with reference to the accompanying drawings, in which:

FIG. 5 illustrates the potential V in the photodiode of FIG. 4 as a function of the position in the photodiode of the embodiment of FIG. 4.

DETAILED DESCRIPTION

Like features have been designated by like references in the various figures. In particular, the structural and/or functional features that are common among the various embodiments may have the same references and may have identical structural, dimensional and material properties.

For the sake of clarity, only the operations and elements that are useful for an understanding of the described embodiments herein have been illustrated and described in detail. In particular, the applications of the photodiodes will not be described in detail.

Unless indicated otherwise, when reference is made to two elements that are connected together, this means a direct connection without any intermediate elements other than conductors, and when reference is made to two elements that are linked or coupled together, this means that these two elements can be connected or be linked or coupled by way of one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

One solution for increasing the speed of movement of the electrons in the direction of the memories is the formation of an electric field in the photodiode, for example by applying a gradual voltage to the photodiode, the voltage being lower away from the contact and higher close to the contact.

Figure 1A:
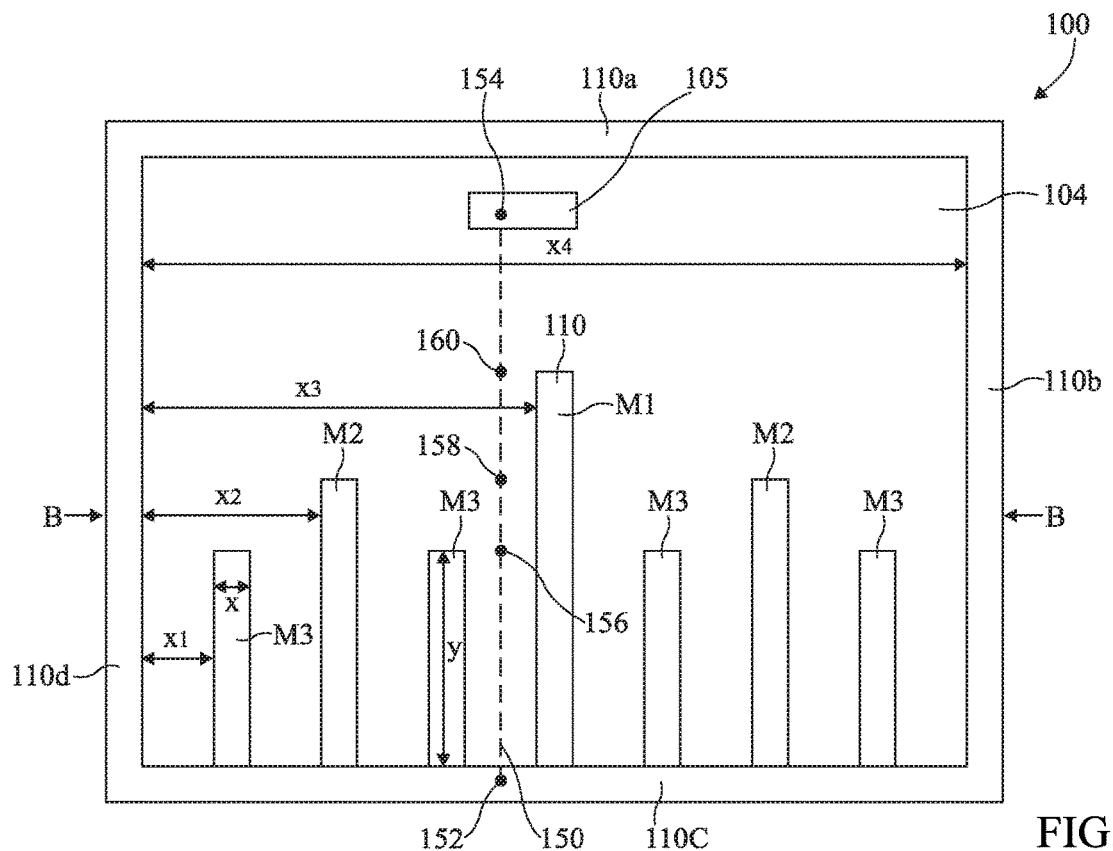
FIGS. 1A and 1B illustrate, via a top view and a sectional view, an embodiment of a photodiode.
Figure 1B:
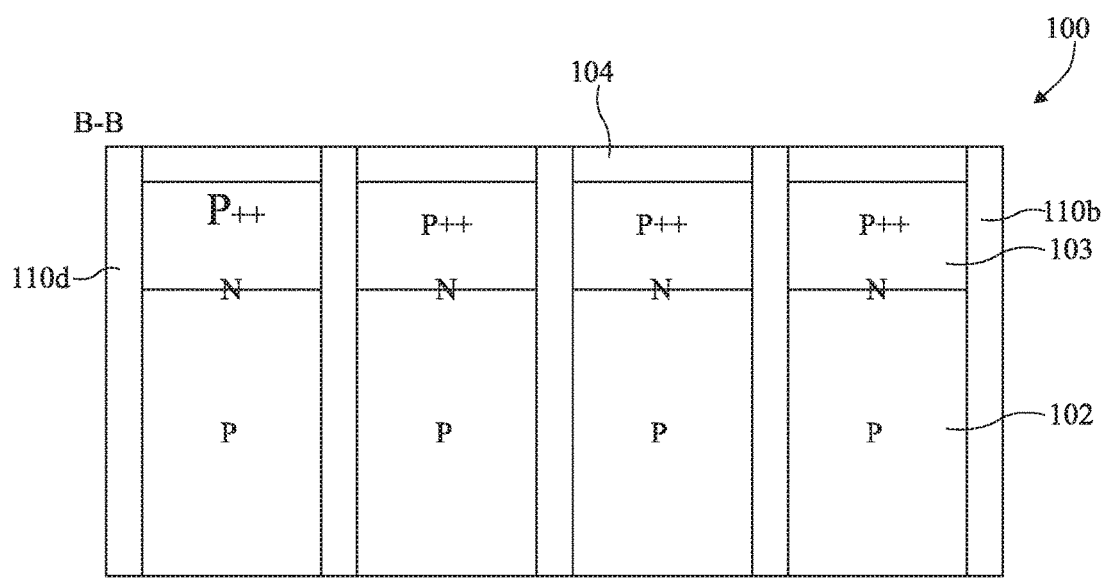

FIG. 1A illustrates a top view and FIG. 1B illustrates a sectional view along the plane B-B shown in FIG. 1A, an embodiment of a photodiode 100.

The photodiode 100 is located in a semiconductor substrate, for example made of silicon and comprises a PN junction. The PN junction comprises a p-type semiconductor layer 102 covered by an n-type semiconductor layer 103. The layer 103 is, for example, covered by a heavily p-doped (P++) semiconductor layer 104. The semiconductor layers 102, 103 and 104 are, for example, made of silicon.

The photodiode 100 comprises a connection pad 105. The pad 105 makes possible, for example, a connection between the photodiode 100 and further electric components, for example a sampling system potentially comprising transfer gates, memories or n-type semiconductor areas forming nodes.

FIG. 1A merely illustrates a single pad 105. In practice, the photodiode 100 can comprise a plurality of pads 105. For example, two pads 105 can be located on the layer 104.

The photodiode 100 comprises walls 110, or trenches, extending along the entire height of the photodiode. In the following text, wall or trench is understood to be a structure made of a semiconducting material, for example made of silicon. For example, the walls 110 extend at least from the upper face of the layer 103 to the lower face of the layer 102. Preferably, the walls 110 extend through the entire semiconductor substrate in which the photodiode 110 is formed. In the example of FIG. 1B, the walls also traverse the layer 104.

The walls 110 include outer walls, which completely surround, in the example of FIG. 1A, the photodiode. More specifically, the photodiode 100 is surrounded by the outer walls 110a, 110b, 110c and 110d. The outer walls 110a and 110c are, for example, substantially parallel. Likewise, the outer walls 110b and 110d are, for example, substantially parallel. The outer walls 110a and 110c are, for example, substantially perpendicular to the outer walls 110b and 110d.

The wall 110a is, for example, the wall closest to the one or more connection pads 105, among the walls 110a, 110b, 110c and 110d. The connection pad 105 illustrated in FIG. 1A is, for example, located substantially at an equal distance from the walls 110b and 110d.

When the photodiode 100 comprises a plurality of pads 105, the pads 105 can, for example, form a line parallel to the walls 110a and 110c.

The walls 110 comprise, in addition to the outer walls 110a, 110b, 110c and 110d, inside or central walls, substantially parallel to the walls 110b and 110d, extending from the wall 110c. The inside walls and the walls 110b and 110d form the branches of a structure in the shape of a comb. The branches are, in the example of FIG. 1A, interconnected by the wall 110c.

In the example shown in FIG. 1A, the comb comprises nine walls, including the walls 110b and 110d. Preferably, the comb comprises an odd number of walls.

The comb shown in FIG. 1A comprises:

a first inside wall M1 (of a row 1), which is the longest of the inside walls, where length is measured in the plane shown in FIG. 1A;

two second inside walls M2 (of a row 2), each second wall having, preferably, a length substantially equal to ¾ of the length of the first wall M1;

four third inside walls M3 (of a row 3), each third wall having, preferably, a length y substantially equal to ¾ of the length of the second walls M2.

For example, the pad 105 is located in the part of the photodiode between the wall 110a and the end of the inside wall M1.

Each inside wall 110 is contained between two walls of a greater length. In the example shown in FIG. 1A, the wall M1 is contained between the walls 110b and 110d. Each wall M2 is, in this example, contained between the wall M1 and one of the outer walls 110b, 110d. Each wall M3 is, in this example, contained between one of the walls M2 and the wall M1 or between one of the walls M2 and one of the outer walls 110b, 110d.

More generally, the comb comprises at least the outer walls 110b and 110d (or walls M0) and at least the inside wall M1. The comb comprises n rows of walls M1 to Mn, wherein n is an integer greater than or equal to 1, and preferably less than or equal to 3. The comb comprises, preferably, $2^{(i-1)}$ walls Mi of the row i (^ representing the power function), with i an integer comprised in the range of 1 to n. The length of each wall Mi of row i is, preferably, substantially equal to ¾ of the length of the walls Mi−1, for i comprised in the range of 2 to n. Each wall Mi−1 of row i−1, with i an integer in the range of 2 to n, is located between a wall Mj and a wall Mk, j and k being integers less than i, j and k potentially being equal to the same integer.

The walls 110, for example, all have a same width x, the width being the smallest dimension of the walls when viewed from above (in the view shown by the plane of FIG. 1A), for example comprised in the range of approximately 100 nm and approximately 300 nm. Each wall is, for example, separated from the next closest wall by a distance x1 substantially equal to 5*x (* represents a multiplication).

In the example shown in FIG. 1A, the walls M2 are separated from the walls 110b or 110d and from the wall M1 by a distance x2 substantially equal to 11*x. The wall M1 is separated from the outer walls 110b and 110d by a distance x3, substantially equal to 23*x. The outer walls 110b and 110d are separated by a distance x4 substantially equal to 47*x.

The shortest walls, i.e. the walls Mn (M3 in FIG. 1A), have, for example, a length comprised in the range of 200 nm and 1500 nm when viewed from above. Preferably, the walls of a same row have substantially the same length when viewed from above.

The inside (central) and outer walls 110 are connected to a source of negative voltage, for example substantially less than −1 V. For example, a same negative voltage is applied to all the walls 110, the walls 110 being interconnected.

The negative voltage applied to the walls causes the formation of a gradual electrostatic potential in the photodiode. More specifically, the electrostatic potential is lower in the parts of the photodiode where the walls are closest (at the walls Mn) than at the pad 105, around which there are no inside walls Mi. The electric field produced by this potential gradient, preferably substantially constant, makes it possible for the electrons formed by the photodiode to move more rapidly.

As a variant, the walls located substantially perpendicular to the inside walls Mi may not be formed. Thus, the outer walls may only partially surround the active zone of the photodiode. For example, the wall 110a and/or the wall 110c may not be present. If the wall 110c is absent, the inside walls are thus coupled by other means to an application node for applying the negative voltage, preferably to a same application node for applying the negative voltage.

Figure 2:
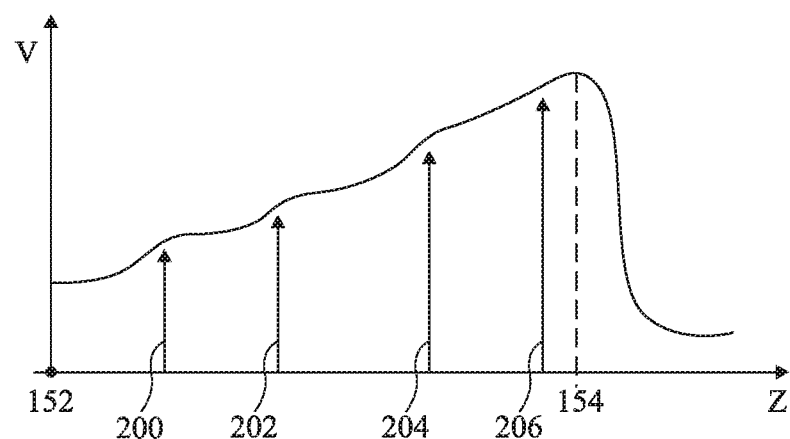
FIG. 2 illustrates the potential V in the photodiode of FIGS. 1A and 1B as a function of the position in the photodiode of the embodiment of FIGS. 1A and 1B.

FIG. 2 illustrates an example of variations of a potential V in the photodiode, as a function of the position (Z) on a path 150 (FIG. 1A) beginning at a point 152 (FIG. 1A), in the wall 110c, and ending in a memory (not illustrated), electrically connected by way of the connection pad 105 (FIG. 1A).

The origin of the axis of the abscissae corresponds to the point 152 located in the wall 110c.

FIG. 2 comprises arrows 200, 202, 204 and 206. Each arrow corresponds to the passage into a different area of the photodiode 100.

The arrow 200 corresponds to the passage into a first area, delimited, on the path 150, by the wall 110c on one side and a point 156 on the other (FIG. 1A). More specifically, the first area extends from the wall 110c to the end of the walls M3. This is the area in which an electron is always located at a distance less than the distance x1 from a wall. The potential V in the first area is greater than in the wall 110c and increases as it approaches the point 156.

The arrow 202 corresponds to the passage into a second area, delimited, on the path 150, by the point 156 on one side and a point 158 on the other (FIG. 1A). More specifically, the second area extends from the end of the walls M3 to the end of the walls M2. This is the area in which an electron is always located at a distance less than the distance x2 from a wall. The potential V in the second area is greater than in the first area and increases as it approaches the point 158.

The arrow 204 corresponds to the passage into a third area, delimited, on the path 150, by the point 158 on one side and a point 160 on the other (FIG. 1A). More specifically, the third area extends from the end of the walls M2 to the end of the wall M1. This is the area in which an electron is always located at a distance less than the distance x3 from a wall. The potential V in the third area is greater than in the second area and increases as it approaches the point 160.

The arrow 206 corresponds to the passage into a fourth area, delimited, on the path 150, by the point 160 on one side and a point 154 on the other (FIG. 1A). More specifically, the fourth area extends from the end of the wall M1 to the pad 105. This is the area in which an electron is always located at a distance less than the distance x4 from a wall. The potential V in the fourth area is greater than in the third area and increases as it approaches the point 154.

Thus, the potential V in the photodiode, representative of the electric field present in the photodiode, is gradual between the point 152 and the point 154, increasing as one approaches the wall 110a and the pad 105.

The drop in the potential V after the point 154 corresponds to the passage into the sampling system.

Figure 3:
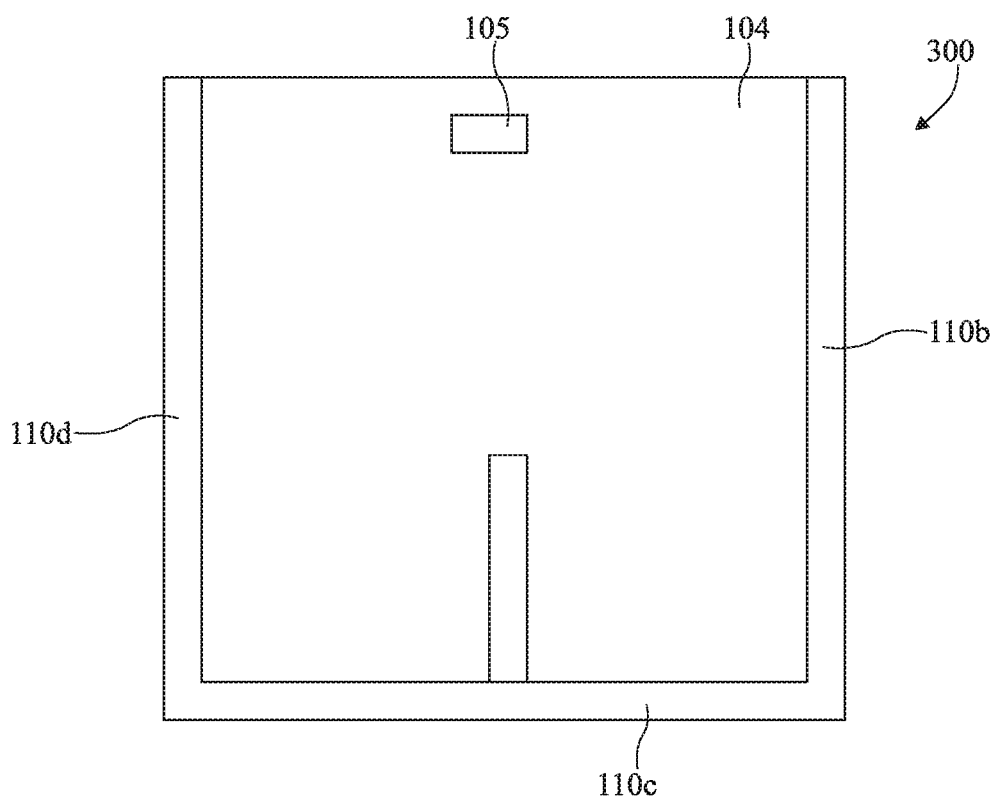
FIG. 3 illustrates, via a top view, a further embodiment of the photodiode.

FIG. 3 illustrates, via a top view, a further embodiment of a photodiode 300.

The photodiode 300 comprises, like the photodiode 100 of FIGS. 1A and 1B, an n-type doped layer 103 (illustrated in FIG. 1B), a p-type doped layer 102 (illustrated in FIG. 1B) and a heavily p++-type doped layer 104. In addition, the photodiode comprises the walls 110b, 110c and 110d. The wall 110a is not present in the example shown in FIG. 3.

The photodiode 300 comprises, in addition to the walls M0 110b and 110d, only the wall M1. The walls 110 (M0 and M1) extend along the entire height of the photodiode 300, as was described for the walls 110 shown in FIG. 1B.

The photodiode 300 comprises, in addition, one or more connection pads 105, such as described in the foregoing. A single pad 105 is illustrated in FIG. 3. In practice, a plurality of pads 105 can be located on the photodiode 300.

In the case of the embodiment shown in FIG. 3, the variation in potential between the wall 110c and the one or more connection pads 105 is more irregular than in the embodiment shown in FIGS. 1A and 1B. Thus, the acceleration caused by the electric field is lower. However, the provision of a single wall M1 occupies less surface area in the active zone of the photodiode than the walls M1, M2 and M3 of the embodiment shown in FIGS. 1A and 1B.

More generally, the increase of the integer n corresponding to the number of rows of walls produces a continuity in the variation of the potential V, i.e. a more regular variation of the potential V. This continuity also produces a loss of surface area in the active zone of the photodiode. However, this loss of surface area is at least partially compensated by the walls 110. Indeed, the walls 110 traverse the photodiode and thus accelerate the movement of electrons located along the height of the photodiode, including electrons that would not have been attracted by the connection pads 105 in the absence of the electric field caused by the walls 110. The yield of the photodiode is thus increased.

Figure 4:
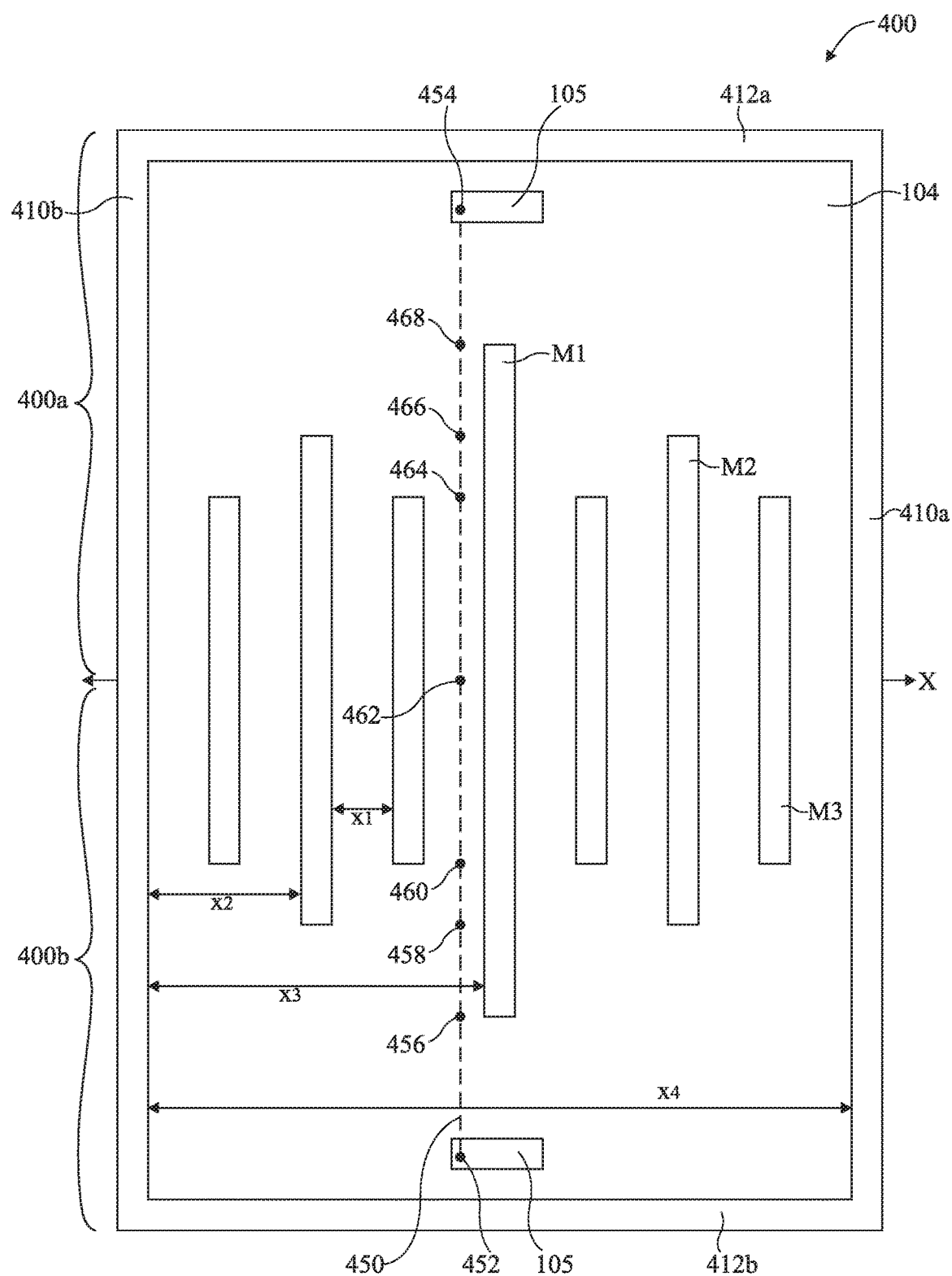
FIG. 4 illustrates a further embodiment of a photodiode.

FIG. 4 depicts a further embodiment of a photodiode 400.

The photodiode comprises two parts 400a and 400b. Each of these parts 400a and 400b is similar to the photodiode 100 shown in FIG. 1, with the exception of the wall 100c. The parts 400a and 400b are symmetrical with respect to an axis X located between the parts 400a and 400b, at the site, for each part, where the wall 110c was located.

The photodiode 400 thus comprises, like the photodiode 100 of FIGS. 1A and 1B and the photodiode 300 of FIG. 3, an n-type doped layer 103 (illustrated in FIG. 1B), a p-type doped layer 102 (illustrated in FIG. 1B) and a heavily p++-type doped layer 104.

The photodiode comprises outer walls 410a, 410b, 412a and 412b. The walls 412a and 412b correspond to the walls 110a of each part 400a and 400b. The axis X is, for example, substantially at an equal distance from the walls 412a and 412b.

The photodiode 400 comprises, in addition, outer walls 410a and 410b. The walls 410a and 410b correspond to the walls 110b and 110d of the parts 400a and 400b.

The outer walls 410a and 410b are, for example, substantially parallel to each other. Likewise, the outer walls 412a and 412b are, for example, substantially parallel to each other. The outer walls 410a and 410b are, for example, substantially perpendicular to the outer walls 412a and 412b.

Like the outer walls 110a and 110c of the preceding embodiments, the outer walls 412a and 412b may not be present.

The photodiode 400 comprises, in this example, two connection pads 105. A connection pad 105 is located at the wall 412a and a further connection pad 105 is located at the wall 412b, in the same way that a connection pad was located at the wall 110a in the embodiment of FIGS. 1A and 1B. Each connection pad is, for example, located substantially at an equal distance from the walls 410a and 410b. For example, each pad 105 is located in the part of the photodiode between a wall 412a or 412b and one of the ends of the wall M1.

As a variant, the photodiode can comprise a greater number of connection pads 105, as mentioned in relation to FIGS. 1A and 1B.

The photodiode 400 comprises, in addition, the inside (central) walls M1 to Mn. The inside walls M1 to Mn extend, for example, from the axis X toward the walls 412a and 412b. Preferably, the length of each inside wall is substantially equal in each of the parts 400a and 400b.

The inside walls are not, in this example, interconnected by a wall 110c, as in FIGS. 1A and 1B. Nevertheless, the walls 410a, 410b and the inside walls form the branches of a comb.

Thus, like the photodiode 100 of FIGS. 1A and 1B, the photodiode 400 comprises:

a first wall M1, the longest of the inside walls;

two second walls M2, each second wall having, preferably, a length substantially equal to ¾ of the length of the first wall M1;

four third walls M3, each third wall having, preferably, a length substantially equal to ¾ of the length of the second walls.

Each inside (central) wall is contained between two walls of greater length. In the example shown in FIG. 4, the wall M1 is contained between the walls 410a and 410b, each wall M2 is contained between the wall M1 and one of the outer walls 410a, 410b, each wall M3 is contained between one of the walls M2 and the wall M1 or between one of the walls M2 and one of the outer walls 410a, 410b.

More generally, the photodiode 400 comprises at least the outer walls 410a and 410b (or walls M0) and at least the inside wall M1. The photodiode 400 comprises n rows of walls M1 to Mn, wherein n is an integer greater than or equal to 1, and preferably less than 3. The photodiode 400 comprises, preferably, $2^{(i-1)}$ walls Mi (^ representing the power function), with i an integer comprised in the range of 1 to n. The length of each wall Mi of row i is, preferably, substantially equal to ¾ of the length of the walls Mi of row i−1, for i comprised in the range of 2 to n. Each wall Mi−1, with i an integer in the range of 1 to n, is located between a wall Mj and a wall Mk, j and k being integers less than i.

The walls 110, i.e. the inside walls Mi, all have, for example, a same width x, the width being the smallest dimension when viewed from above, for example comprised in the range of approximately 100 nm and approximately 300 nm. The walls are, for example, separated from the adjacent walls by a distance x1 substantially equal to 5*x (* represents a multiplication).

In the example of FIG. 4, the walls M2 are separated from the walls 410a or 410b and from the wall M1 by a distance x2 substantially equal to 11*x. The wall M1 is separated from the outer walls 410b or 410b by a distance x3, substantially equal to 23*x. The outer walls 410a and 410b are separated by a distance x4 substantially equal to 47*x.

The shortest walls, i.e. the walls Mn (M3 in FIG. 1A), have, for example, a length comprised in the range of 400 and 3000 nm.

The inside walls are connected to a source of negative voltage, for example substantially less than −1 V. For example, a same negative voltage is applied to all the inside walls. The walls M1 to Mn and the outer walls 410a, 410b, 412a and 412b are, for example, coupled to one another by way of connection elements not illustrated, for example one or more metallization levels and conductive vias, or conductive wires.

The negative voltage applied to the walls 110 causes the formation of a gradual electrostatic potential in the photodiode. More specifically, the electrostatic potential is lower in the parts of the photodiode 400 where the walls are closest (at the walls Mn) than at the pads 105, around which there are no inside walls Mi. The electric field produced by this electrostatic potential makes it possible for the electrons formed by the photodiode on either side of the photodiode to move more rapidly.

As a variant, the walls located substantially perpendicular to the inside walls Mi may not be formed. For example, the wall 412a and/or the wall 412b may not be present.

FIG. 5 illustrates an example of variations of a potential V, as a function of the position on a path 450 (FIG. 4) starting at a first electron collection point, for example a first memory, and ending in a second electron collection point, for example a second memory, by way of the connection pads 105, illustrated by the points 452 and 454 of the path 450 (FIG. 4). The origin of the axis of the abscissae thus corresponds to the first memory.

The variations are similar to the variations described in relation to FIG. 2 for each part 400a and 400b.

FIG. 5 comprises arrows 504, 506, 508, 510, 512, 514 and 516. Each arrow corresponds to the passage into a different area of the photodiode 400.

The arrow 510 illustrates the point 462 located at the intersection between the path 450 and the axis X of symmetry of the photodiode 400. The electrons located between the point 462 and the wall 412a will move toward the point 454. The electrons located between the point 462 and the wall 412b will move toward the point 452.

The zone 550 between the arrows 508 and 512 corresponds to the variations in potential between the points 460 (FIG. 4) and 464 (FIG. 4), i.e. in a first area in which an electron is always located at a distance that is less than the distance x1 from a wall. The potential V in the first area is greater and increases as it approaches the points 460 and 464.

The arrows 508 and 512 correspond to the passages into second areas located, on the path 150, between the points 460 and 458 for one and between the points 464 and 466 for the other (FIG. 4). These are the areas of the photodiode 400, illustrated by the zones 552, in which an electron is always located at a distance that is less than the distance x2 from a wall. The potential V in the second areas is greater than in the first area and increases as it approaches the points 458 and 466.

The arrows 506 and 514 correspond to the passages into third areas located, on the path 150, between the points 458 and 456 for one and between the points 466 and 468 for the other (FIG. 4). These are the areas of the photodiode 400, illustrated by the zones 554, in which an electron is always located at a distance that is less than the distance x3 from a wall. The potential V in the third areas is greater than in the second areas and increases as it approaches the points 456 and 468.

The arrows 504 and 516 correspond to the passages into fourth areas located, on the path 150, between the points 456 and 452 for one and between the points 468 and 454 for the other (FIG. 4). These are the areas of the photodiode 400, illustrated by the zones 556, in which an electron is always located at a distance that is less than the distance x4 from a wall. The potential V in the fourth areas is greater than in the third areas and increases as it approaches the points 452 and 454.

Thus, the potential V in the photodiode 400, representative of the electric field, is gradual between the point 462 and the points 452 and 454, increasing as one approaches the walls 412a and 412b. This makes it possible to increase the speed of the electrons toward one or the other of the connection pads.

The considerable rise 500 and the considerable drop 502 in potential represent the passages into the memories, by way of the connection pads 105.

One could have chosen to deposit multiple electrodes on the surface of the photodiode, each electrode being at a different potential so as to form the desired electric field. However, such a structure requires obtaining different voltages and thus requires a complex power management circuit. Moreover, such a structure is costly in terms of energy.

An advantage of the embodiments described here is that a single voltage is supplied to the walls 110. Implementing the power management of the described embodiments is thus simple.

One could also have chosen the shape of the photodiode so that the photodiode had, when viewed from above, a width that decreased along a rounded curve as one moved away from a connection pad 105. By this means, it would have been possible to form a gradual electrostatic potential in the photodiode. However, this would involve the formation of a photodiode with a complex shape the manufacture of which is not easy. Moreover, this would lead to considerable limitations regarding the shape and the dimensions of the photodiodes.

An advantage of the described embodiments is that the walls are in contact with the semiconductor layers 102 and 103 along their entire height. Thus, the electric field is located, likewise, along the entire volume of the photodiode. The speed of the electrons is thus accelerated regardless of their position in the photodiode. This is not the case in examples where the negative voltage is only applied to the upper face of the photodiode.

Various embodiments and variants have been described. Those skilled in the art will understand that certain features of these embodiments can be combined and other variants will readily occur to those skilled in the art. In particular, the n and p doping types can be reversed.

Finally, the practical implementation of the embodiments and variants described herein is within the capabilities of those skilled in the art based on the functional description provided hereinabove.

The invention claimed is:

1. A photodiode, comprising:
a semiconductor substrate which includes a first substrate layer of a first dopant type and a second substrate layer of a second dopant type on top of the first substrate layer;
a plurality of semiconductor walls in the semiconductor substrate;
wherein the plurality of semiconductor walls include:
first and second outer semiconductor walls extending parallel to each other in a first direction, each of the first and second outer walls having a first length; and
a plurality of inside semiconductor walls extending parallel to each other in the first direction and positioned between the first and second outer semiconductor walls, said plurality of inside semiconductor walls including:
a first inside semiconductor wall having a second length less than the first length; and
second and third inside semiconductor walls each having a third length less than the second length, wherein the second inside semiconductor wall is positioned between the first outer semiconductor wall and the first inside semiconductor wall and wherein the third inside semiconductor wall is positioned between the second outer semiconductor wall and the first inside semiconductor wall.

2. The photodiode of claim 1, wherein the plurality of inside semiconductor walls are centered along their lengths at a common axis which extends between and perpendicular to the first and second outer semiconductor walls.

3. The photodiode of claim 2, wherein the plurality of semiconductor walls further include third and fourth outer semiconductor walls extending parallel to each other in a second direction perpendicular to the first direction, and wherein the plurality of inside semiconductor walls are positioned between the third and fourth outer semiconductor walls.

4. The photodiode of claim 3, wherein ends of the third and fourth outer semiconductor walls are coupled to ends of the first and second outer semiconductor walls.

5. The photodiode of claim 3, wherein the third and fourth outer semiconductor walls and the first and second outer semiconductor walls at least partially surround an active zone of the photodiode.

6. The photodiode of claim 3, wherein the third and fourth outer semiconductor walls and the first and second outer semiconductor walls surround an active zone of the photodiode.

7. The photodiode of claim 2, wherein the plurality of plurality of inside semiconductor walls further include:
fourth and fifth inside semiconductor walls each having a fourth length greater than the third length, wherein the fourth inside semiconductor wall is positioned between the first outer semiconductor wall and the second inside semiconductor wall and wherein the fifth inside semiconductor wall is positioned between the second outer semiconductor wall and the third inside semiconductor wall.

8. The photodiode of claim 7, wherein the fourth length is less than the second length.

9. The photodiode of claim 7, wherein the plurality of plurality of inside semiconductor walls further include:
sixth and seventh inside semiconductor walls each having a fifth length less than the fourth length, wherein the sixth inside semiconductor wall is positioned between the first outer semiconductor wall and the fourth inside semiconductor wall and wherein the seventh inside semiconductor wall is positioned between the second outer semiconductor wall and the fifth inside semiconductor wall.

10. The photodiode of claim 9, wherein the fifth length is equal to the third length.

11. The photodiode of claim 1, wherein the plurality of semiconductor walls further include a third outer semiconductor wall extending in a second direction perpendicular to the first direction, and wherein ends of the plurality of inside semiconductor walls are coupled to the third outer semiconductor wall.

12. The photodiode of claim 11, wherein the third outer semiconductor wall and the first and second outer semiconductor walls at least partially surround an active zone of the photodiode.

13. The photodiode of claim 11, wherein the plurality of semiconductor walls further include a fourth outer semiconductor wall extending in the second direction parallel to the third outer semiconductor wall, and wherein the plurality of inside semiconductor walls are positioned between the third and fourth outer semiconductor walls.

14. The photodiode of claim 13, wherein ends of the third and fourth outer semiconductor walls are coupled to ends of the first and second outer semiconductor walls.

15. The photodiode of claim 13, wherein the third and fourth outer semiconductor walls and the first and second outer semiconductor walls surround an active zone of the photodiode.

16. The photodiode of claim 11, wherein the plurality of inside semiconductor walls further include:
fourth and fifth inside semiconductor walls each having a fourth length greater than the third length, wherein the fourth inside semiconductor wall is positioned between the first outer semiconductor wall and the second inside semiconductor wall and wherein the fifth inside semiconductor wall is positioned between the second outer semiconductor wall and the third inside semiconductor wall.

17. The photodiode of claim 16, wherein the fourth length is less than the second length.

18. The photodiode of claim 16, wherein the plurality of inside semiconductor walls further include:
sixth and seventh inside semiconductor walls each having a fifth length less than the fourth length, wherein the sixth inside semiconductor wall is positioned between the first outer semiconductor wall and the fourth inside semiconductor wall and wherein the seventh inside semiconductor wall is positioned between the second outer semiconductor wall and the fifth inside semiconductor wall.

19. The photodiode of claim 18, wherein the fifth length is equal to the third length.

20. The photodiode of claim 1, wherein the first and second outer semiconductor walls and the plurality of inside semiconductor walls extend completely through the first and second substrate layers.

21. The photodiode of claim 1, further comprising an upper semiconductor substrate layer of the first dopant type on top of the second semiconductor layer, and wherein the first and second outer semiconductor walls and the plurality of inside semiconductor walls extend through the first, second and upper semiconductor substrate layers.

22. The photodiode of claim 1, wherein a negative voltage is applied to the first and second outer semiconductor walls and the plurality of inside semiconductor walls.

23. The photodiode of claim 1, wherein each semiconductor wall of the first and second outer semiconductor walls and the plurality of inside semiconductor walls has a width perpendicular to its length, said width in a range of approximately 100 nm to approximately 300 nm.

24. The photodiode of claim 1, wherein each semiconductor wall of the plurality of inside semiconductor walls has a width perpendicular to its length, and wherein adjacent inside semiconductor walls are separated from each other by a distance equal to substantially five times the width.

25. The photodiode of claim 1, wherein each semiconductor wall of the plurality of inside semiconductor walls has a width perpendicular to its length, and wherein the inside semiconductor wall closest the outer semiconductor wall is separated therefrom by a distance equal to substantially five times the width.

* * * * *